United States Patent
Vaufrey

(10) Patent No.: US 9,825,089 B2
(45) Date of Patent: Nov. 21, 2017

(54) EMISSIVE DEVICE INCLUDING FIRST AND SECOND ADJACENT PIXELS SHARING THE SAME SEMICONDUCTOR LIGHT-EMITTING STACK

(71) Applicants: COMMISSARIAT A L'ENERGIE ATOMIQUE ET AUX ENERGIES ALTERNATIVES, Paris (FR); ALCATEL LUCENT, Boulogne Billancourt (FR)

(72) Inventor: David Vaufrey, Grenoble (FR)

(73) Assignees: COMMISSARIAT A L'ENERGIE ATOMIQUE ET AUX ENERGIES ALTERNATIVES, Paris (FR); ALCATEL LUCENT, Boulogne Billancourt (FR)

( * ) Notice: Subject to any disclaimer, the term of this patent is extended or adjusted under 35 U.S.C. 154(b) by 0 days.

(21) Appl. No.: 14/942,687

(22) Filed: Nov. 16, 2015

(65) Prior Publication Data
US 2016/0141332 A1 May 19, 2016

(30) Foreign Application Priority Data
Nov. 17, 2014 (FR) ..................................... 14 61056

(51) Int. Cl.
*H01L 27/15* (2006.01)
*H01L 33/38* (2010.01)
(Continued)

(52) U.S. Cl.
CPC .......... *H01L 27/156* (2013.01); *H01L 27/153* (2013.01); *H01L 33/005* (2013.01);
(Continued)

(58) Field of Classification Search
CPC ... H01L 27/153; H01L 27/156; H01L 33/005; H01L 33/08; H01L 33/38; H01L 33/387; H01L 33/62
See application file for complete search history.

(56) References Cited

U.S. PATENT DOCUMENTS

2010/0078659 A1  4/2010 Iizuka et al.
2010/0207851 A1* 8/2010 Cok ..................... G09G 3/3208
                                                     345/82
(Continued)

FOREIGN PATENT DOCUMENTS

JP    2007-207977 A    8/2007
JP    2009-71140 A     4/2009

OTHER PUBLICATIONS

French Search Report and Written Opinion dated Jul. 8, 2015 issued in corresponding application No. FR1461056; w/ partial English translation and partial English machine translation (14 pages).

*Primary Examiner* — Stephen W Smoot
(74) *Attorney, Agent, or Firm* — Westerman, Hattori, Daniels & Adrian, LLP

(57) ABSTRACT

The emissive device includes first and second adjacent pixels (1a, 1b) sharing a common semiconductor light-emitting stack (2) and each defining an area (4a, 4b) of photon emission. The first and second pixels (1a, 1b) are configured in such a way that supplying current to the first pixel (1a) causes photons to be emitted, by the light-emitting stack (2), only in the emission area (4a) of said first pixel (1a).

21 Claims, 2 Drawing Sheets

(51) Int. Cl.
   *H01L 33/00*            (2010.01)
   *H01L 33/62*            (2010.01)
   *H01L 33/08*            (2010.01)

(52) U.S. Cl.
   CPC ............ *H01L 33/387* (2013.01); *H01L 33/62* (2013.01); *H01L 33/08* (2013.01); *H01L 33/38* (2013.01)

(56) References Cited

U.S. PATENT DOCUMENTS

2012/0061711 A1    3/2012    Li et al.
2015/0056728 A1*    2/2015    Vaufrey .................. H01L 33/38
                                                                 438/22

* cited by examiner

EMISSIVE DEVICE INCLUDING FIRST AND SECOND ADJACENT PIXELS SHARING THE SAME SEMICONDUCTOR LIGHT-EMITTING STACK

TECHNICAL FIELD OF THE INVENTION

The invention relates to the field of electronics, and more particularly to the emission of photons.

The subject of the invention is more particularly an emissive device including first and second adjacent pixels.

PRIOR ART

Many devices/displays capable of displaying data, or quite simply producing light, are formed from a multitude of light sources that are juxtaposed to form a planar matrix array. Such displays may be plasma displays, liquid-crystal displays (LCDs), organic light-emitting diode (OLED) displays or light-emitting diode (LED) displays, depending on the nature of the light source used.

Displays may be classed into two broad families: emissive displays and non-emissive displays. Emissive displays are characterized by the use of a plurality of specifically controlled point light sources, each source forming a pixel of the display. In contrast, non-emissive displays are continuously backlit by a backlight common to all the pixels, as is the case for LCD screens. In LCD screens, each pixel is formed by a liquid-crystal-based optical valve.

Displays may also be classed by the method used to address their pixels. Matrix arrays may be said to be passive or active. In passive matrix arrays, the pixels of a given row (or given column) are supplied with power one after the other. Hence, each pixel is turned on only for a very short length of time, and it is therefore necessary to supply each pixel with a high current density if the average luminance perceived by an observer over the row (or column) scan time is to be high enough. In an active matrix array, each pixel is supplied with power individually and may therefore be left turned on until the next image refresh.

It follows from what was said above that it is preferable for each pixel to be selectively addressable, as in an active matrix array, in order to make it possible to control display characteristics of said pixels.

FIG. 1 illustrates two adjacent pixels 1a, 1b of a pixel matrix array such as known in the prior art; each pixel 1a, 1b comprises an independent stack 2a, 2b that is associated therewith in such a way as to allow each pixel to be turned on independently by selective addressing. The pixels 1a, 1b may be obtained by forming a main multilayer stack that is then singulated into independent pixel stacks 2a, 2b, this singulation being achieved by forming separate islands in the principal stack. After singulation, it is necessary to passivate the sidewalls of each independent stack 2a, 2b in order to prevent short circuiting of the diode forming the pixel. This passivation is achieved via deposition of a suitable material 3.

As a result, the number of technological operations that must be carried out to produce such displays is high, and it is difficult to miniaturize the pixels because of the gaps and passivation required between two pixels.

SUBJECT OF THE INVENTION

The aim of the present invention is to provide a solution that completely or partially remedies the drawbacks listed above, this solution especially allowing known devices to be miniaturized.

This aim is at least partially achieved by virtue of an emissive device including first and second adjacent pixels sharing a common semiconductor light-emitting stack and each defining an area of photon emission, the first and second pixels being configured in such a way that supplying current to the first pixel causes photons to be emitted, by the light-emitting stack, only in the emission area of said first pixel.

In particular, in the context of this device, the following features may be implemented:
the first and second pixels each include a first electrical contact configured to inject charge carriers of a first type into the light-emitting stack, and a second electrical contact configured to inject charge carriers of a second type into the light-emitting stack;
the first electrical contacts of the first and second pixels are electrically connected together;
the second electrical contacts of the first and second pixels are configured to be selectively biased by an addressing system of the emissive device with a view to injecting charge carriers of the second type;
and, when the first pixel is supplied with current, the current density between the first electrical contact of the second pixel and the second electrical contact of the first pixel is lower than the current density at which said second pixel starts to emit photons.

According to one variant, the area of contact of the first electrical contact of each pixel with the light-emitting stack is smaller than the area of contact of the second electrical contact of each pixel with the light-emitting stack.

In particular, current may have a spreading length in the first pixel, and the distance separating the first electrical contact of the first pixel from the second pixel is larger than one or five times the spreading length of the current in the first pixel.

According to one particular exemplary embodiment, the first and second pixels are aligned in a straight line in such a way that $L_p$ is a dimension of each of said first and second pixels along said straight line, said dimension of said first and second pixels being contained in a main emission area of the emissive device including the emission areas of said first and second pixels, $L_{C1}$ is a dimension of the first contact of each of the first and second pixels along said straight line and $S_{C2}$ is a distance separating the two second contacts of the first and second pixels along said straight line, and the distance D, where $$D = \frac{L_P}{2} - \frac{L_{C1}}{2} + \frac{S_{C2}}{2},$$

meets the condition D>Ls, or D≥5 Ls, or D≥7 Ls, or D≥11 Ls, where Ls is the spreading length of current in the first pixel.

In particular, the first and second pixels may each include a first electrical contact configured to inject charge carriers of a first type into the light-emitting stack and a second electrical contact configured to inject charge carriers of a second type into the light-emitting stack, and the first and second electrical contacts of each of the first and second pixels are placed on either side of the light-emitting stack but not facing.

In particular, the first electrical contacts of the first and second pixels may be shaped so as to delimit the periphery of the emission areas of the first and second pixels, the first electrical contacts and the second electrical contacts of the first and second pixels being arranged in such a way that their projections onto a given plane, said given plane being perpendicular to the stacking direction of said light-emitting stack, do not overlap.

In particular, the first electrical contacts of the first and second pixels are electrically connected together.

According to one variant, the device may have a configuration in which:
- the first electrical contacts of the first and second pixels inject charge carriers of the first type into the light-emitting stack;
- the second electrical contact of the first pixel injects charge carriers of the second type into the light-emitting stack;
- the centre of the first pixel sees the sum of the contributions of each point of the first electrical contact of the first pixel so that a portion of the light-emitting stack corresponding to the first pixel generates photons; and
- the second electrical contact of the second pixel not being biased, the carriers injected by the second electrical contact of the first pixel do not allow photons to be generated in another portion of the light-emitting stack, which portion is associated with the second pixel.

According to one variant, the light-emitting stack includes a first face, on which rest the first electrical contacts of said first and second pixels, and a second face, opposite the first face, on which rest the second electrical contacts of said first and second pixels, said first face of the light-emitting stack forming a main emission face of the emissive device.

Advantageously, the first and second pixels are identical.

The invention also relates to a process for producing an emissive device comprising first and second adjacent pixels sharing a common semiconductor light-emitting stack and each defining an area of photon emission, said process including a step of configuring the light-emitting stack in such a way that supplying current to the first pixel causes photons to be emitted, by the light-emitting stack, only in the emission area of said first pixel.

According to one variant, the configuring step includes:
- a step in which the emission area of the first and second pixels is chosen;
- a step in which shapes and dimensions of the electrical contacts of the first and second pixels are chosen; and
- a step of producing the light-emitting stack depending on the chosen emission areas and the chosen shapes and dimensions of the electrical contacts.

In particular, the step of producing the light-emitting stack may include a step of defining a test light-emitting stack and a step of calculating the spreading length associated with the defined test stack, said test light-emitting stack being validated if its calculated spreading length meets a criterion of comparison with a dimension associated with at least the first pixel.

BRIEF DESCRIPTION OF THE DRAWINGS

Other advantages and features of the invention will become more clearly apparent from the following description of particular embodiments thereof, which are given by way of nonlimiting example and illustrated in the appended drawings, in which.

DESCRIPTION OF PREFERRED EMBODIMENTS OF THE INVENTION

The term "substantially" is understood in the present description to mean exactly or to within plus or minus 10%.

The present invention proposes to use, for a plurality of pixels, the same common light-emitting stack. In this respect, there is no longer any need either to produce trenches to singulate the pixel stacks, or to passivate the space between two adjacent pixels. As a result two adjacent pixels may be placed closer together and/or the emission area of the pixels may be increased. Thus it becomes easier to miniaturize emissive devices and/or increase the resolution in terms of pixels for a constant emissive-device display area.

The present invention more particularly relates to light-emitting diode (LED) based emissive devices employing active or passive addressing. The invention is particularly suitable for LED-based emissive devices the pixels of which are very small in size.

In other words, a pixel in the present description may form a light-emitting diode.

Up to now, it has been generally accepted that it is necessary for each pixel to comprise its own independent stack, in order to prevent carriers injected to turn on a given pixel from generating photons anywhere but in said pixel, i.e. in order to prevent addressing a particular pixel causing photon generation in an adjacent pixel. In contrast, the present invention teaches that singulation is not necessary and that it is possible to configure a first pixel in such a way that supplying it with current causes photons to be emitted only in an emission zone corresponding to the display area of said first pixel, even if said first pixel shares a common stack with a second pixel that is adjacent thereto. In other words, in this case, if the second pixel is turned off it will not turn on when the first pixel is biased.

In the present description, the expression "adjacent pixels" is understood to mean two pixels the emission areas of which are juxtaposed.

Generally, each pixel is capable of selectively adopting an on-state and an off-state. In the off-state a pixel does not emit photons, and in the on-state it does emit photons.

A pixel defines an emission area. Depending on the intended use of the emissive device, this emission area is a display area (case of a screen) or a lighting area (case of a bulb). The sum of the various emission areas forms a main emission area of the emissive device. In particular, the emission area of a pixel corresponds to a face of the pixel through which photons escape to the exterior of the device when the corresponding pixel is turned on. The emission area of a pixel may comprise a portion covered, or may be delimited, by an electrode segment intended to inject carriers into the stack in said pixel.

Figure 1:
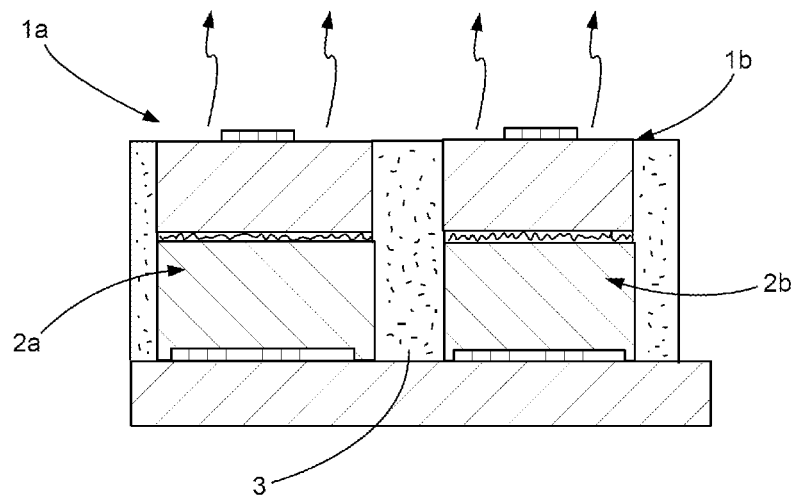
FIG. 1 is a cross-sectional view of two adjacent pixels according to the prior art.
Figure 2:
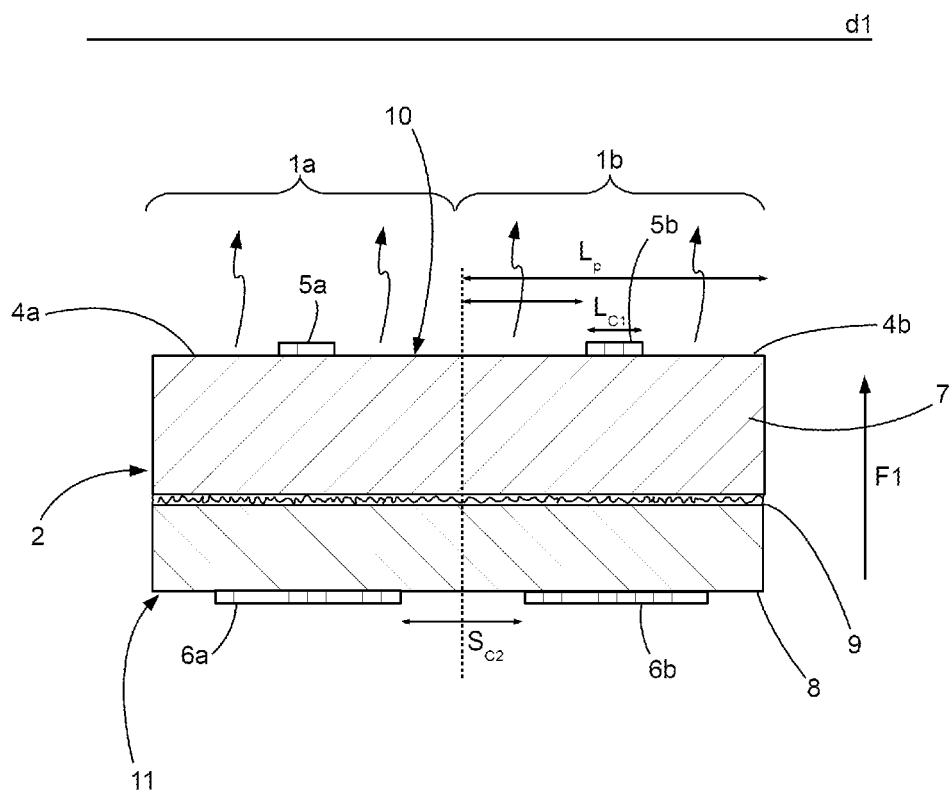
FIG. 2 is a cross-sectional view of an emissive device comprising two adjacent pixels according to one embodiment of the invention.
Figure 3:
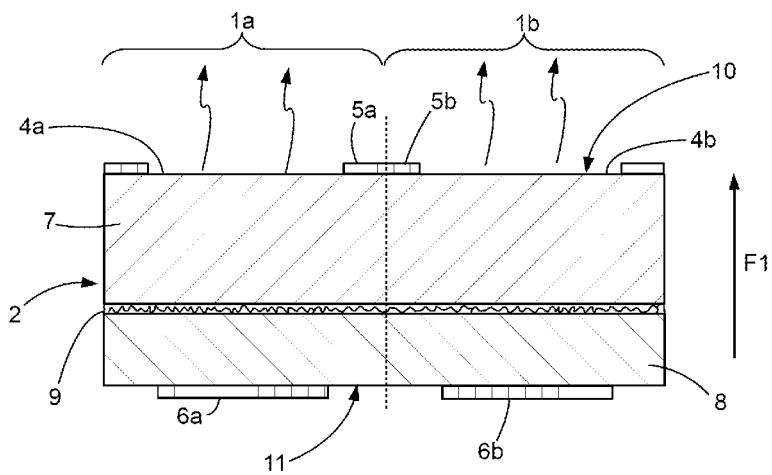
FIG. 3 is a cross-sectional view of an emissive device comprising two adjacent pixels according to another embodiment of the invention.
Figure 4:
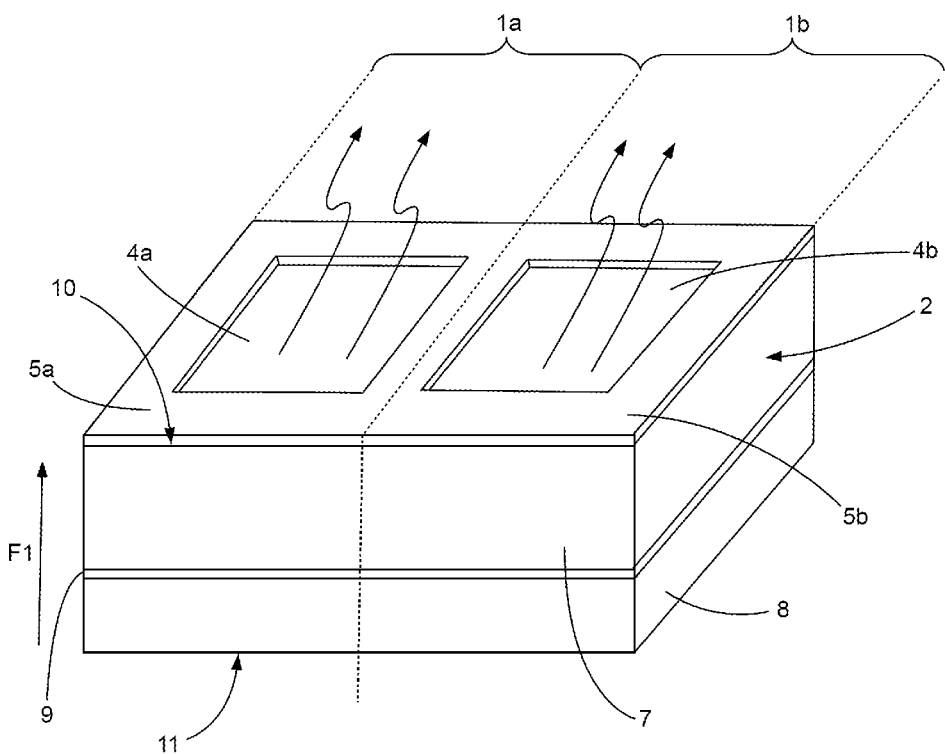
FIG. 4 is a perspective view of the device in FIG. 3.

According to one embodiment illustrated in FIGS. 2 to 4, the emissive device includes a first pixel 1a and a second pixel 1b adjacent to the first pixel 1a. The first and second pixels 1a, 1b share a common semiconductor light-emitting stack 2 and each define an area 4a, 4b of photon emission. The first and second pixels 1a, 1b are configured in such a way that supplying current to the first pixel 1a causes photons to be emitted, by the light-emitting stack 2, only in the emission area 4a of said first pixel 1a. Preferably, said configuration of the first and second pixels 1a, 1b may also be such that supplying current to the second pixel 1b causes photons to be emitted, by the light-emitting stack 2, only in the emission area 4b of said second pixel 1b.

A given pixel may be supplied with current by suitable means.

For example, a pixel is supplied with current via two electrical contacts 5a, 6a (5b, 6b) forming electrodes of said pixel 1a, 1b, said contacts 5a, 6a (5b, 6b) injecting charge carriers into a corresponding portion of the light-emitting stack 2. The electrical contacts 5a, 6a (5b, 6b) are placed on either side of the corresponding portion of the light-emitting stack 2 and opposite each other in the stacking direction F1 of said stack. These two electrical contacts 5a, 6a (5b, 6b) are a cathode and an anode, respectively. According to one embodiment, the cathodes of the pixels may all make electrical contact with one another, and an addressing system may allow the anodes of the pixels to be separately addressed in order to control individual turn-on of each pixel. Inversely, it is also possible for the anodes all to make electrical contact with one another and for an addressing system to allow the cathodes to be separately addressed in order to control individual turn on of each pixel.

In other words, each pixel (first and second pixels in the example, but not limited to only two pixels) may include a first electrical contact of a first type, and a second electrical contact of a second type (the first electrical contacts of all the pixels being placed on a first face of the light-emitting stack 2, and the second electrical contacts of all the pixels being placed on a second face, opposite the first face, of the light-emitting stack 2), in such a way that when a large enough current passes between the first and second contacts of a given pixel, the latter turns on. Here the first electrical contacts of all the pixels are electrically connected together and the second electrical contacts of all the pixels are individually addressable. The first type and the second type are chosen from: an anode or a cathode. The emission areas of the pixels may be inscribed on the first face or the second face of the light-emitting stack 2. In the case where the stack is intended to form a GaN diode, it is preferable for the cathode to be common to all the pixels.

The light-emitting stack 2 may include various layers arranged in a stacking direction illustrated by the arrow F1 in FIGS. 2 to 4. The various layers of the light-emitting stack 2 are then preferably included in a corresponding plane substantially perpendicular to the direction F1 of the light-emitting stack 2. According to one particular example, the light-emitting stack 2 includes at least one first semiconductor layer 7, which is especially n-doped, and a second semiconductor layer 8, which is especially p-doped. An active layer 9 is preferably inserted between the first and second layers 7, 8. The active layer 9 for example includes quantum wells that promote the recombination of the carriers injected by the electrodes of the various pixels. Alternatively, the active layer 9 may simply be formed by the contact interface between the layers 7 and 8.

The first and second semiconductor layers may be formed from gallium nitride.

Preferably, the expression "supplying current to one particular pixel (the first or second pixel in the example) causes photons to be emitted, by the light-emitting stack, only in the emission area of said particular pixel", is understood to mean that the emissive device is such that when a pixel adjacent to said particular pixel is in its off-state, the on-state of the particular pixel has no influence on the state of the adjacent pixel.

The desired configuration that a pixel must have to prevent the latter from causing an adjacent pixel to turn on, or the on-state of the latter from being modified, is especially dictated by the distribution of the current injected into the portion of the light-emitting stack corresponding to this pixel, and especially by the distribution of the current injected into the active layer of the common light-emitting stack. In this respect, two adjacent pixels may be dimensioned in such a way as to take into account the spreading length (dispersion length) of the current. The spreading length of the current allows the distribution of the current to be described, depending on the circumstances, in the plane of the active layer of the light-emitting stack. Specifically, the spreading length of the current is the distance in the plane of the active layer between two points, the first point being the point through which the maximum current density passes and the second point being a point where the current density is equal to the maximum current density divided by Euler's number e: $J(x)/J(x=0)=1/e$.

The spreading length of the current may be calculated, provided the thicknesses and resistivities of the layers of the light-emitting stack are known, using the following formula:

$$Ls = \sqrt{(\Sigma \rho_c + \Sigma \rho_\perp \cdot d_\perp) \cdot \left| \frac{\rho_n}{d_n} - \frac{\rho_e}{d_e} \right|^{-1}}$$

$\Sigma \rho_c$ corresponds to the sum of the contact resistances between the various materials of the device. The formula may be simplified by neglecting this term.

$\Sigma \rho_\perp \cdot d_\perp$ corresponds to the sum of the products of the resistance and thickness of the various materials passed through by an axis normal to the plane of the device.

$\rho_n, \rho_e$ correspond to the resistivities of the n-doped layers and of the electrode making contact with the p-doped layer, respectively.

$d_n, d_e$ correspond to the thicknesses of the n-doped layer and of the electrode making contact with the p-doped layer. This thickness is measured along an axis parallel to the stacking direction of said light-emitting stack.

Thus, it should be understood that taking into account the spreading length of the current during production of the emissive device makes it possible to design the latter in such a way as to maximize the luminous efficacy thereof.

In this respect, the invention also relates to a process for producing the emissive device such as described, this process especially including a step of configuring the light-emitting stack 2 in such a way that supplying current to the first pixel 1a causes photons to be emitted, by the light-emitting stack 2, only in the emission area 4a of said first pixel 1b.

This configuring step may especially include a step of calculating the spreading length of a stack of the emissive device with a view to validating whether or not the emissive device works as it should. In particular, the spreading length may be calculated by determining (theoretically or empirically) the resistivities and thicknesses of the layers of the light-emitting stack 2. A stack will possibly be chosen, i.e. validated, when the light-emitting stack 2 allows a chosen spreading length to be obtained. Preferably, the thicknesses of the layers of the light-emitting stack 2 will be modulated so as to preserve minimal resistivities, with a view to saving time during manufacture and decreasing production cost by decreasing the length of the epitaxial growth steps. Once validated, the emissive device may be manufactured on an industrial scale. The chosen spreading length may depend on the dimensions of the pixels of the emissive device and especially on the shapes and dimensions of the electrical contacts (first and second electrical contacts) of each of the pixels.

With regard to what was described above, the first and second pixels 1a, 1b each include a first electrical contact 5a, 5b configured so as to inject charge carriers of a first type into the light-emitting stack 2, and a second electrical contact 6a, 6b configured so as to inject charge carriers of a second type into the light-emitting stack 2.

The charge carriers may be electrons or holes.

The light-emitting stack 2 may have a first face 10, on which rest the first electrical contacts 5a, 5b of said first and second pixels 1a, 1b, and a second face 11, opposite the first face 10, on which rest the second contacts 6a, 6b of said first and second pixels 1a, 1b. The first and second faces 10, 11 are placed along a straight line parallel to the stacking direction F1 of said light-emitting stack 2, and each is preferably contained in a corresponding plane perpendicular to the stacking direction F1 of said light-emitting stack 2. Preferably, the first face 10 of the light-emitting stack 2 forms the main emission face of the emissive device.

According to a particular first embodiment, illustrated in FIG. 2, the first electrical contacts 5a, 5b of the first and second pixels 1a, 1b are electrically connected together. In other words, they may form a single electrode divided into a plurality of zones, each zone then forming the first electrical contact 5a, 5b of a corresponding pixel 1a, 1b. In this case, the second electrical contacts 6a, 6b of the first and second pixels 1a, 1b may be configured so as to be selectively biased by an addressing system of the emissive device with a view to injecting charge carriers of the second type into the light-emitting stack 2. Thus to prevent untimely turn-on of the second pixel 1b when the first pixel 1a is supplied with current, the current density between the first electrical contact 5b of the second pixel 1b and the second electrical contact 6a of the first pixel 1a must be lower than the current density at which said second pixel 1b starts to emit photons.

It will thus be understood here that the emissive device is such that it may have a configuration in which:
  the charge carriers of the first type are injected into the light-emitting stack 2 in the first and second pixels 1a, 1b;
  only the second electrical contact 6a of the first pixel 1a is biased so as to inject charge carriers of the second type into the light-emitting stack 2 in the first pixel 1a; and
  the current is zero between the second contact 6a of the first pixel 1a and the first contact 5b of the second pixel 1b, such that charge carriers of the first type injected into the second pixel 1b are unable to recombine in said second pixel 1b with charge carriers of the second type injected by the second contact 6a of the first pixel 1a.

In the first embodiment, the area of contact of the first electrical contact 5a, 5b of each pixel 1a, 1b with the light-emitting stack 2 is preferably smaller than the area of contact of the second electrical contact 6a, 6b of each pixel 1a, 1b with the light-emitting stack 2. For reasons of the luminous efficacy of the light-emitting stack, the first electrical contacts of the various pixels will be placed, in the emission area of the corresponding pixel, so as to limit shadowing of the active layer of the light-emitting stack and therefore to limit absorption of the photons generated in the light-emitting stack 2 by the first electrical contacts. In other words, the first electrical contact 5a, 5b of each pixel 1a, 1b covers a portion of the emission area 4a, 4b of said pixel 1a, 1b. The first electrical contact 5a, 5b of each pixel 1a, 1b may be formed vertically in line with the corresponding second electrical contact 6a, 6b in a frame of reference in which a horizontal plane contains said second electrical contact 6a, 6b. Thus, it will be understood that said first face 10 of the light-emitting stack 2 forms the main emission face of the emissive device. Furthermore, here the first electrical contacts are preferably formed in the centre of the emission area associated with the corresponding pixel. Of course, the converse is also true when the emission areas of the pixels are associated with the second contacts 6a, 6b; in this case, the area of contact of the first contact 5a, 5b of each pixel with the light-emitting stack 2 is preferably larger than the area of contact of each second contact 6a, 6b with the light-emitting stack 2.

To return to the spreading length of the current, in this first embodiment the current has a spreading length in the first pixel 1a, and the distance separating the first electrical contact 5a of the first pixel 1a from the second pixel 1b is larger or equal to five times the spreading length of the current in the first pixel 1a. The contrary is also preferably true, swapping the first and second pixels.

According to one particular variant of this first embodiment, the first electrical contacts 5a, 5b form cathodes, especially making contact with an n-doped GaN layer. The first electrical contacts 5a, 5b are preferably cathodes because of the high conductivity of n-doped GaN relative to the conductivity of p-doped GaN. Specifically, a point electrode cannot provide a uniform distribution of current in the plane of the active layer of the stack unless the semiconductor making contact with said electrode has a conductivity that is very much higher than that of the semiconductor of opposite conductivity.

According to one particular example of the first embodiment such as illustrated in FIG. 2, the first and second pixels 1a 1b are aligned along a straight line d1 in such a way that $L_p$ is a dimension of each of said first and second pixels 1a, 1b along said straight line d1, said dimension of said first and second pixels being contained in a main emission area of the emissive device including the emission areas of the first and second pixels (preferably this main emission area is contained in a plane), $L_{C1}$ is the dimension of the first contact 5a, 5b of each of the first and second pixels 1a, 1b along said straight line d1 and $S_{C2}$ is the distance separating the two second contacts 6a, 6b of the two first and second pixels 1a, 1b along said straight line d1. In this particular example, the spreading length of current in the first pixel 1a is smaller than the distance D separating the first electrical contact 5a of the first pixel 1a from the second pixel 1b, which can be calculated by:

$$D = \frac{L_P}{2} - \frac{L_{C1}}{2} + \frac{S_{C2}}{2} \qquad \text{(eq. 1)}$$

Moreover, in this particular example, the emission area 4a, 4b of each pixel 1a, 1b is preferably square in shape, two substantially parallel sides of which square are also substantially parallel to said straight line d1. Thus, the distance $L_p$ corresponds to the shortest distance separating two substantially parallel opposite sides of the emission area of the pixel in question.

More particularly, the notion "spreading length in the first pixel 1a smaller than D" is based on the equality J(x)/J(x=0)

=1/e. In this respect, if only the leftmost pixel 1a in FIG. 2 is electrically powered, the following relationship holds true:

$$J(x=D) < Jmin(Luminance > 0)$$

It is desired for $J(x=D)=J(x=0)\cdot\exp(-D/Ls) < Jmin(Luminance > 0)$ where $Jmin(Luminance > 0)=1e-3$ A/cm², which is a value observed for commercial diodes; at this current density, the diodes do not yet emit photons.

If $J(x=0)=100$ A/cm², i.e. a very high operating current, $J(x=D)=100\cdot\exp(-D/Ls) < 1e-3$ or $\exp(-D/Ls) < 1e-3/1e-2 = 1e-5$ and more particularly $-D/Ls < -5 \ln 10$ is obtained, meeting the above principle. The condition that D be greater than or equal to about 11 Ls is thus obtained.

According to another acceptable condition, $Jmin=1e-1$ A/cm² may be chosen, thereby modifying the above calculations to $-D/Ls < -3 \ln 10$, namely a condition that D be greater than or equal to about 7 Ls.

More generally, other acceptable embodiments may be obtained by relaxing the above conditions and considering $D \geq 5$ Ls, or even $D > Ls$.

It will therefore be understood that it is possible, during production of the emissive device that it is desired to manufacture, to determine, once the dimensions desired for the pixels have been set, how to arrange the emissive device. In this respect, the dispersion length Ls of the current must be modulated to meet the above inequality. The dispersion length of the current may be modulated in a number of ways:
- decreasing the thickness $d_n$ of the n-GaN layer;
- increasing the resistivity $\rho_n$ of the n-GaN layer;
- or a combination of the above two propositions, i.e. obtaining a higher sheet resistance for the n-GaN layer.

In other words, where:

$$Ls = \sqrt{(\Sigma \rho_c + \Sigma \rho_\perp \cdot d_\perp) \cdot \left|\frac{\rho_n}{d_n} - \frac{\rho_e}{d_e}\right|^{-1}}$$

If $$\frac{\rho_n}{d_n} \gg \frac{\rho_e}{d_e}$$

then $$\left|\frac{\rho_n}{d_n} - \frac{\rho_e}{d_e}\right| = \left|\frac{\rho_n}{d_n}\right|$$

$$Ls = \sqrt{(\rho_n d_n + \rho_p d_p) \cdot \left|\frac{\rho_n}{d_n}\right|^{-1}} =$$

$$\sqrt{\frac{(\rho_n d_n + \rho_p d_p)}{\frac{\rho_n}{d_n}}} = \sqrt{\frac{\rho_n d_n}{\frac{\rho_n}{d_n}} + \frac{\rho_p d_p}{\frac{\rho_n}{d_n}}} = \sqrt{d_n^2 + \frac{\rho_p d_p d_n}{\rho_n}}$$

From the expression for Ls, it may be deduced that to decrease Ls, it is necessary for $d_n$ to be small (1$^{st}$ criterion) and for $$\frac{\rho_p d_p d_n}{\rho_n}$$

to be small. To minimize $$\frac{\rho_p d_p d_n}{\rho_n},$$

it is necessary to minimize $$\frac{\rho_p}{\rho_n},$$

i.e. to minimize $\rho_p$ and/or maximize $\rho_n$.

In practice, it is easy to maximize $\rho_n$ because the resistivity of the n-GaN layers may easily be modulated between 1e-3 ohm·cm and 100 ohm·cm.

In contrast, the resistivity of p-GaN layers is difficult to minimize since common values are about 1 ohm·cm. For optimal operation of a given pixel forming a diode, the constraint $$\frac{\rho_p}{\rho_n}$$

will preferably be chosen such that $$100 > \frac{\rho_p}{\rho_n} > 1$$

(i.e. preferably $1 > \rho_n > 1e-2$ and in particular $1 > \rho_n > 1e-1$ if $\rho_p = 1$ ohm·cm) (2$^{nd}$ criterion).

Also in practice, and again with the objective of optimizing operation of a given pixel, the thickness of p-GaN being about a few hundred nanometers, to minimize the term $$\frac{\rho_p d_p d_n}{\rho_n}$$

the thickness of n-GaN is preferably decreased and the thickness of p-GaN not decreased (i.e. preferably $d_n < 1$ μm where $d_p \approx 300$ nm and in particular $d_n < 700$ nm where $d_p \approx 300$ nm).

Drastically decreasing the area of the pixel imposes a second limitation induced by the dimensions of the cathode. Specifically, the cathode must have a minimum size to be able to pass a large current (100 A/cm²) and will therefore cover an increasingly large portion of the pixel area as the area of the pixel is decreased. In the example in FIG. 2, the emission area is partially occulted by a nontransparent cathode.

In other words, it will be understood from the above description that the configuring step may include: a step in which the emission area 4a, 4b of the first and second pixels 1a, 1b is chosen; a step in which shapes and dimensions of the electrical contacts of the first and second pixels 1a, 1b are chosen; and a step of producing the light-emitting stack 2 depending on the chosen emission areas 4a, 4b and the chosen shapes and dimensions of the electrical contacts. The production step may especially include the use of a spreading length for the current chosen as described above.

More particularly, the step of producing the light-emitting stack 2 includes a step of defining a test light-emitting stack and a step of calculating the spreading length associated with the defined test light-emitting stack, said test light-emitting stack 2 being validated if its calculated spreading length of current meets a criterion of comparison with a dimension associated with at least the first pixel 1a; in other words the test light-emitting stack is validated if it allows a pixel to be turned on without turning on the adjacent pixel when in its off-state.

According to a second embodiment, illustrated in FIGS. 3 and 4, the first and second pixels 1a, 1b each include a first electrical contact 5a, 5b configured so as to inject charge carriers of a first type into the light-emitting stack 2 and a second electrical contact 6a, 6b configured so as to inject charge carriers of a second type into the light-emitting stack 2. According to this embodiment, the first and second electrical contacts of each of the first and second pixels 1a, 1b are placed on either side of the light-emitting stack 2 but not facing.

In other words, the first electrical contacts 5a, 5b and second electrical contacts 6a, 6b of the first and second pixels 1a, 1b are advantageously arranged in such a way that their projections onto a given plane, said given plane being perpendicular to the stacking direction F1 of said light-emitting stack 2, do not overlap. This especially prevents a shadowed zone, from which it would be more difficult for photons to escape, from being created between the first and second contacts of a pixel.

In this case, preferably, the first electrical contacts 5a, 5b are shaped so as to delimit the periphery of the emission areas 4a, 4b of the first and second pixels 1a, 1b. In other words, the first and second electrical contacts 5a, 5b may each have a closed-loop shape extending around the periphery of said corresponding pixel.

Moreover, in this embodiment, the first electrical contacts 5a, 5b of the first and second pixels 1a, 1b are preferably electrically connected together. These first and second electrical contacts 5a, 5b may be formed by zones of a given electrically conductive layer. Here, the first contact 5b of the second pixel 1b may have a portion in common with the first contact 5a of the first pixel 1a.

In other words, according to this second embodiment, the emissive device may have a configuration in which:
the first electrical contacts 5a, 5b of the first and second pixels 1a, 1b inject charge carriers of the first type into the light-emitting stack 2;
the second electrical contact 6a of the first pixel 1a injects charge carriers of the second type into the light-emitting stack 2;
the centre of the first pixel 1a sees the sum of the contributions of each point of the first electrical contact 5a of the first pixel 1a so that a portion of the light-emitting stack 2 corresponding to the first pixel 1a generates photons; and
the second electrical contact 6b of the second pixel 1b not being biased, the carriers injected by the second electrical contact 6a of the first pixel 1a do not allow photons to be generated in another portion of the light-emitting stack 2, which portion is associated with the second pixel 1b.

It will be understood that in this second embodiment, by positioning the first electrical contact (preferably the cathode) peripherally, the emissive area of the pixel delimited by the planar dimensions of the second electrical contact (preferably the anode) is not at all occulted by the first electrical contact. Intuitively, it could be imagined that the centre of the pixel would not be supplied with power because of the small spreading length of the current. However, each point of the peripheral electrode behaves as a current source and the centre of the pixel then sees the sum of the contributions of each point of said first electrical contact (as predicted by superposition theorem). There is therefore a concentration of the current. In contrast, on the periphery of the first electrical contact, the contribution of each point of the electrode is dispersed over a larger area. There is then a dilution of the current.

Whatever the embodiment or variant, the first and/or second electrical contacts 5a, 5b will be chosen or formed in such a way that the interfaces between the first electrical contact 5a and/or the second electrical contact 5b and the light-emitting stack are weakly reflective. The notion "weakly reflective" is advantageously understood to mean that reflection between the electrode (first and/or second electrical contact 5a, 5b) and the semiconductor (light-emitting stack 2) reflects less than 60%, and preferably less than 50% of the light generated by the light-emitting stack 2. This may especially be achieved when the first and/or second electrical contacts 5a, 5b make intimate contact with the light-emitting stack 2 and are formed by a layer that does not contain Sm, Ag or Al and the thickness of which is no greater than the skin depth of the metal. For example, the following materials may possibly be used with the thicknesses indicated between the parentheses: Au (500 nm) or Ti(20 nm)/Au(500 nm) or Cr(20 nm)/Au(500 nm), etc.

The pixels therefore remain "pseudo-isolated" from one another. The electrodes located in the emission areas of the pixels may comprise a segment that is opaque to the emitted photons so as to clearly delimit neighbouring pixels.

This arrangement of the closed-loop shaped first contacts, which all make electrical contact with one another, allows the current to be uniformly distributed within the pixels. Furthermore, the pixels are better defined, and a better contrast is obtained as a result, providing a viewer with excellent visual comfort. Thus, preferably, in the second embodiment the first electrical contacts are formed in such a way as to be opaque to the photons generated by the pixels.

Four particular examples are given below.

According to a first example, the thickness $d_n$ of the first semiconductor layer 7, which is especially n-doped, is 700 nm; the thickness $d_p$ of the second semiconductor layer 8, which is especially p-doped, is 300 nm; $\rho_n$=1e-3 ohm·cm and $\rho_p$=1 ohm·cm. The spreading length of the current is therefore Ls=14.5 µm. In this respect, the corresponding pixel half length is advantageously chosen larger than 159.5 µm, for example 160 µm.

According to a second example, the thickness $d_n$ of the first semiconductor layer 7, which is especially n-doped, is 1 µm; the thickness $d_p$ of the second semiconductor layer 8, which is especially p-doped, is 300 nm; $\rho_n$=1e-1 ohm·cm and $\rho_p$=1 ohm·cm. The spreading length of the current is therefore Ls=2 µm. In this respect, the corresponding pixel half length is advantageously chosen larger than 22 µm, for example 25 µm. In this example, the embodiment in which the electrodes do not face each other will be preferred because otherwise the upper electrode will have to be smaller than 25 µm in size, which would be costly technologically speaking and would lead to a substantial portion of the emissive area of the diode being masked.

According to a third example, the thickness $d_n$ of the first semiconductor layer 7, which is especially n-doped, is 2 µm; the thickness $d_p$ of the second semiconductor layer 8, which is especially p-doped, is 300 nm; $\rho_n$=1e-2 ohm·cm and $\rho_p$=1 ohm·cm. The spreading length of the current is therefore Ls=8 µm. In this respect, the corresponding pixel half length is advantageously chosen larger than 88 µm, for example 90 µm.

According to a fourth example, the thickness $d_n$ of the first semiconductor layer 7, which is especially n-doped, is 1 µm; the thickness $d_p$ of the second semiconductor layer 8, which is especially p-doped, is 300 nm; $\rho_n$=1e-2 ohm·cm and $\rho_p$=1 ohm·cm. The spreading length of the current is therefore Ls=5.5 μm. In this respect, the corresponding pixel half length is advantageously chosen larger than 60.5 μm, for example 65 μm.

In the examples given above, the half length of a pixel corresponds to the minimum distance separating the first contact of a pixel from an adjacent pixel in the context of the first embodiment. In this case, with regard to first electrodes 5 (first electrical contacts of the pixels) that are electrically connected so as to be common to all the pixels, a point of a first electrode associated with one pixel must not be able to generate a current that allows an adjacent pixel to emit light, this problem especially arising when two adjacent pixels are turned on but with different currents. The numerical values in these examples were calculated to meet the most demanding condition, namely D≥11 Ls. Naturally, other embodiments may easily be obtained by considering another condition, especially D≥5 Ls.

In the present description, reference has been made to two adjacent pixels of the emissive device. Of course, the emissive device may include a plurality of pixels arranged, for example, to form a matrix array. In this case, for each pair of adjacent pixels of the plurality of pixels, what was said in the present description may apply.

The invention claimed is:

1. Emissive device including first and second adjacent pixels sharing a common semiconductor light-emitting stack and each defining an area of photon emission, wherein:
   the first and second adjacent pixels each include a first electrical contact configured to inject charge carriers of a first type into the light-emitting stack, and a second electrical contact configured to inject charge carriers of a second type into the light-emitting stack;
   the first electrical contacts of the first and second pixels are electrically connected together;
   the second electrical contact of the first pixel is dedicated to the first pixel and the second electrical contact of the second pixel is dedicated to the second pixel, the second electrical contacts of the first and second pixel being independent from each other;
   the second electrical contacts of the first and second pixels are configured to be selectively biased by an addressing system of the emissive device with a view to injecting charge carriers of the second type;
   and wherein, when the first pixel is supplied with current, the current density between the first electrical contact of the second pixel and the second electrical contact of the first pixel is lower than the current density at which said second pixel starts to emit photons so that the first and second pixels are configured in such a way that supplying current to the first pixel causes photons to be emitted, by the light-emitting stack, only in the emission area of said first pixel.

2. Device according to claim 1, wherein the area of contact of the first electrical contact of each pixel with the light-emitting stack is smaller than the area of contact of the second electrical contact of each pixel with the light-emitting stack.

3. Device according to claim 2, wherein the current has a spreading length in the first pixel, and wherein the distance separating the first electrical contact of the first pixel from the second pixel is larger than the spreading length of the current in the first pixel.

4. Device according to claim 3, wherein the distance separating the first electrical contact of the first pixel from the second pixel is larger than or equal to at least five times the spreading length of the current in the first pixel.

5. Device according to claim 1, wherein the first and second pixels are aligned in a straight line in such a way that $L_p$ is a dimension of each of said first and second pixels along said straight line, said dimension of said first and second pixels being contained in a main emission area of the emissive device including the emission areas of said first and second pixels, $L_{C1}$ is a dimension of the first contact of each of the first and second pixels along said straight line and $S_{C2}$ is a distance separating the two second contacts of the first and second pixels along said straight line, and wherein the distance D, where $$D = \frac{L_P}{2} - \frac{L_{C1}}{2} + \frac{S_{C2}}{2},$$

meets the condition D>Ls, where Ls is the spreading length of the current in the first pixel.

6. Device according to claim 5, wherein the distance D meets the condition D>5 Ls.

7. Device according to claim 5, wherein the distance D meets the condition D>7 Ls.

8. Device according to claim 5, wherein the distance D meets the condition D>11 Ls.

9. Device according to claim 1, wherein the first and second electrical contacts of each of the first and second pixels are placed on opposite sides of the light-emitting stack but do not face each other along a main direction of the stack.

10. Device according to claim 9, wherein the first electrical contacts of the first and second pixels are shaped so as to delimit the periphery of the emission areas of the first and second pixels, the first electrical contacts and the second electrical contacts of the first and second pixels being arranged in such a way that their projections onto a given plane, said given plane being perpendicular to the stacking direction of said light-emitting stack, do not overlap.

11. Device according to claim 10, wherein the second electrical contacts of the first and second pixels individually addressable.

12. Device according to claim 10, wherein the device has a configuration in which:
   the first electrical contacts of the first and second pixels inject charge carriers of the first type into the light-emitting stack;
   the second electrical contact of the first pixel injects charge carriers of the second type into the light-emitting stack;
   the centre of the first pixel sees the sum of the contributions of each point of the first electrical contact of the first pixel so that a portion of the light-emitting stack corresponding to the first pixel generates photons; and
   the second electrical contact of the second pixel not being biased, the carriers injected by the second electrical contact of the first pixel do not allow photons to be generated in another portion of the light-emitting stack, which portion is associated with the second pixel.

13. Device according to claim 1, wherein the light-emitting stack includes a first face, on which rest the first electrical contacts of said first and second pixels, and a second face, opposite the first face, on which rest the second electrical contacts of said first and second pixels, said first face of the light-emitting stack forming a main emission face of the emissive device.

14. Device according to claim 1, wherein the first and second pixels are identical.

15. Device according to claim 1, wherein the first and second electrical contacts of the first pixel are independent from the first and second contacts of the second pixel.

16. Process for producing an emissive device comprising first and second adjacent pixels sharing a common semiconductor light-emitting stack and each defining an area of photon emission, said process including:
configuring the light-emitting stack in such a way that supplying current to the first pixel causes photons to be emitted, by the light-emitting stack, only in the emission area of said first pixel,
so as to obtain the emissive device according to claim 1.

17. Process according to claim 16, wherein the configuring includes:
choosing the emission area of the first and second pixels;
choosing shapes and dimensions of the electrical contacts of the first and second pixels; and
producing the light-emitting stack depending on the chosen emission areas and the chosen shapes and dimensions of the electrical contacts.

18. Process according to claim 17, wherein the producing of the light-emitting stack includes defining a test light-emitting stack and calculating the spreading length of current associated with the defined test stack, said test light-emitting stack being validated if its calculated spreading length of current meets a criterion of comparison with a dimension associated with at least the first pixel.

19. Emissive device including first and second adjacent pixels sharing a common semiconductor light-emitting stack and each defining an area of photon emission, wherein:
the first and second pixels each include a first electrical contact configured to inject charge carriers of a first type into the light-emitting stack, and a second electrical contact configured to inject charge carriers of a second type into the light-emitting stack;
the first electrical contacts of the first and second pixels are electrically connected together;
the second electrical contacts of the first and second pixels are configured to be selectively biased by an addressing system of the emissive device with a view to injecting charge carriers of the second type;
wherein, when the first pixel is supplied with current, the current density between the first electrical contact of the second pixel and the second electrical contact of the first pixel is lower than the current density at which said second pixel starts to emit photons so that the first and second pixels are configured in such a way that supplying current to the first pixel causes photons to be emitted, by the light-emitting stack, only in the emission area of said first pixel,
wherein the area of contact of the first electrical contact of each pixel with the light-emitting stack is smaller than the area of contact of the second electrical contact of each pixel with the light-emitting stack, and
wherein the current has a spreading length in the first pixel, and wherein the distance separating the first electrical contact of the first pixel from the second pixel is larger than the spreading length of the current in the first pixel.

20. Emissive device including first and second adjacent pixels sharing a common semiconductor light-emitting stack and each defining an area of photon emission, wherein:
the first and second pixels each include a first electrical contact configured to inject charge carriers of a first type into the light-emitting stack, and a second electrical contact configured to inject charge carriers of a second type into the light-emitting stack;
the first electrical contacts of the first and second pixels are electrically connected together;
the second electrical contacts of the first and second pixels are configured to be selectively biased by an addressing system of the emissive device with a view to injecting charge carriers of the second type;
wherein, when the first pixel is supplied with current, the current density between the first electrical contact of the second pixel and the second electrical contact of the first pixel is lower than the current density at which said second pixel starts to emit photons so that the first and second pixels are configured in such a way that supplying current to the first pixel causes photons to be emitted, by the light-emitting stack, only in the emission area of said first pixel, and
wherein the first and second pixels are aligned in a straight line in such a way that $L_p$ is a dimension of each of said first and second pixels along said straight line, said dimension of said first and second pixels being contained in a main emission area of the emissive device including the emission areas of said first and second pixels, $L_{C1}$ is a dimension of the first contact of each of the first and second pixels along said straight line and $S_{C2}$ is a distance separating the two second contacts of the first and second pixels along said straight line, and wherein the distance D, where $$D = \frac{L_p}{2} - \frac{L_{C1}}{2} + \frac{S_{C2}}{2},$$

meets the condition D>Ls, where Ls is the spreading length of the current in the first pixel.

21. Device according to claim 20, wherein the distance D meets the condition D>5 Ls.

\* \* \* \* \*